United States Patent
Taylor et al.

(10) Patent No.: US 10,283,695 B1
(45) Date of Patent: May 7, 2019

(54) METHOD FOR CREATING HIGH-RESOLUTION MICRO- TO NANO-SCALE STRUCTURES IN HIGH-TEMPERATURE SUPERCONDUCTOR FILMS

(71) Applicant: THE UNITED STATES OF AMERICA AS REPRESENTED BY THE SECRETARY OF THE NAVY, Washington, DC (US)

(72) Inventors: Benjamin J. Taylor, Escondido, CA (US); Teresa H. Emery, San Diego, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 186 days.

(21) Appl. No.: 15/200,674

(22) Filed: Jul. 1, 2016

Related U.S. Application Data

(60) Provisional application No. 62/301,547, filed on Feb. 29, 2016.

(51) Int. Cl.
*H01L 39/24* (2006.01)
*H01L 39/02* (2006.01)
*H01L 39/12* (2006.01)
*H01L 39/22* (2006.01)

(52) U.S. Cl.
CPC .......... *H01L 39/249* (2013.01); *H01L 39/025* (2013.01); *H01L 39/126* (2013.01); *H01L 39/225* (2013.01); *H01L 39/2464* (2013.01); *H01L 39/2496* (2013.01)

(58) Field of Classification Search
CPC ............................. H01L 39/126; H01L 39/24
See application file for complete search history.

(56) References Cited

U.S. PATENT DOCUMENTS

| | | | | |
|---|---|---|---|---|
| 5,096,882 A | * | 3/1992 | Kato | ........................ H01F 6/06 |
| | | | | 204/157.41 |
| 6,388,268 B1 | * | 5/2002 | Kim | ...................... H01L 39/225 |
| | | | | 257/30 |
| 9,188,514 B1 | | 11/2015 | Taylor | |

(Continued)

OTHER PUBLICATIONS

Taylor et al. "Preparation of novel HTS films and tunnel junctions for advanced C3I sensor applications." Proceedings vol. 9467, Micro- and Nanotechnology Sensors, Systems, and Applications VII. (Year: 2015).*

(Continued)

*Primary Examiner* — Paul A Wartalowicz
(74) *Attorney, Agent, or Firm* — SPAWAR Systems Center Pacific; Kyle Eppele; Ryan J. Friedl

(57) ABSTRACT

A method includes providing a film of a high-temperature superconductor compound on a substrate, where a portion of the film has a first oxygen state, and exposing a portion of the film to a focused ion beam to create a structure within the film. The structure may result from the portion of the film being partially or completely removed. The structure may be a trench along the length or width of the film. The method may include annealing the exposed portion of the film to a second oxygen state. The oxygen content of the second oxygen state may be greater or less than the oxygen content of the first oxygen state.

17 Claims, 6 Drawing Sheets

(56) References Cited

U.S. PATENT DOCUMENTS

| | | | |
|---|---|---|---|
| 9,589,757 B1* | 3/2017 | Hannon | B24B 37/042 |
| 2003/0102470 A1* | 6/2003 | Il'ichev | H01L 39/2496 |
| | | | 257/31 |
| 2007/0179063 A1* | 8/2007 | Malozemoff | H01L 39/143 |
| | | | 505/329 |
| 2007/0191202 A1* | 8/2007 | Foltyn | H01L 39/143 |
| | | | 501/12 |
| 2010/0197505 A1* | 8/2010 | Steinmeyer | H01L 39/143 |
| | | | 505/230 |

OTHER PUBLICATIONS

Tang, L., "Rewritable Oxide Photodetectors", Nature Photonics, vol. 4, pp. 807-809, 2010.

Baek, S.H. et al., "Ferroelastic switching for nanoscale non-volatile magnetoelectric devices", Nature Materials, vol. 9, pp. 309-314, 2010.

Green, M.A., "The emergence of perovskite solar cells", Nature Photonics, vol. 8, pp. 506-514, 2014.

Foley, C. P., and Hilgenkamp, H., "Why NanoSQUIDs are important: an introduction to the focus issue," Supercond. Sci. Technol. 22, 064001 (2009).

de Andrade, M. C., Leese de Escobar, A., Taylor, B. J., Berggren, S., Higa, B., Dinh, S., Fagaly, R. L., Talvacchio, J., Nechay, B., and Przybysz, J., "Detection of Far Field Radio Frequency Signals by Niobium Superconducting Quantum Interference Device Arrays," IEEE Trans. Appl. Supercond, submitted (2015).

Berggren, S., Fagaiy, R. L., and Leese de Escobar, A. M., "Superconducting Quantum Interference Devices Arranged in Pyramid Shaped Arrays," IEEE Trans. Appl. Supercond. 25, 1600605 (2015).

S. Y. Yang, et al., "Above-bandgap voltages from ferroelectric photovoltaic devices," Nature Nanotechnology, 5, 143 (2010).

Lindemer, T. B., Hunley, J. F., Gates, J. E., Sutton Jr., A. L., Brynestad, J., Hubbard, C. R., and Gallagher, P. K., "Experimental and Thermodynamic Study of Nonstoichiometry in <Yba2Cu3O7?x>," J. Am. Ceram. Soc. 72, 1775 (1989).

Wu, C. H., Jhan, F. J., Chen, J. H., and Jeng, J. T., "High-Tc Josephson junctions fabricated by focused ion beam direct milling," Supercond. Sci. Technol. 26, 025010 (2013).

Baetzold, R. C., "Atomistic simulation of ionic and electronic defects in Yba2Cu3O7," Phys. Rev. B 38, 11304 (1988).

Chandrasekhar, N., Valls, O. T., and Goldman, A. M., "Charging effects observed in Yba2Cu3O7?x films: Influence of oxygen ordering," Phys. Rev. B 49, 6220 (1994).

Grigelionis, G., Tornau, E. E., and Rosengren, A. "Effect of an electric field on oxygen ordering and superconducting temperature of Yba2Cu3O6+x thin films," Phys. Rev. B 53, 425 (1996).

Liang, R., Bonn, D. A., and Hardy, W. N., "Evaluation of CuO2 plane hole doping in Yba2Cu3O6+x single crystals," Phys. Rev. B 73, 180505(R) (2006).

de Fontaine, D., Cedar, G., and Asta, M. , "Low-temperature long-range oxygen order in Yba2Cu3Oz," Nature 343, 544 (1990).

McCormack, R., de Fontaine, D., and Ceder, G., "Oxygen configurations and their effects on charge transfer in off-stoichiometric Yba2Cu3Oz," Phys. Rev. B 45, 12976 (1992).

de Fontaine, D., Ozolins, V. , Islam, Z., and Moss, S. C., "Origin of modulated structures in Yba2Cu3O6:63: A first-principles approach," Phys. Rev. B 71, 212504 (2005).

Michalowski, P., Shapoval, T.. Meier, D., Katzer, C., Schmidl, F., Schultz, L., and Seidel, P., "Enhancement of high-Tc superconducting thin film devices by nanoscale polishing," Supercond. Sci. Technol. 25, 115019 (2012).

Mitchell, E. E., and Foley, C. P., "YbCo step-edge junctions with high IcRn," Supercond. Sci. Technol. 23, 065007 (2010).

Du, J. , Lazar, J. Y., Lam, S. K. H., Mitchell, E. E. and Foley, C. P., "Fabrication and characterisation of series YbCo step-edge Josephson junction arrays," Supercond. Sci. Technol. 27, 095005 (2014).

Cybart, S. A., Cho, E. Y., Wong, T. J., Glyantsev, V. N., Huh, J. U., Yung, C. S., Moeckly, B. H., Beeman, J.W., Ulin-Avila, E.,Wu, S. M., and Dynes, R. C., "Large voltage modulation in magnetic field sensors from two-dimensional arrays of Yba—Cu—O nano Josephson junctions," Appl. Phys. Lett. 104, 062601 (2014).

Cybart, S. A., Cho, E. Y., Wong, T. J., Wehlin, B. H., Ma, M. K., Huynh, C., and Dynes, R. C., "Nano Josephson Superconducting Tunnel Junctions in Y—Ba—Cu—O Direct-Patterned with a Focused Helium Ion Beam," arXiv:1409.4876v1 (2014).

Wu, C. H., Chou, Y. T., Kuo, W. C., Chen, J. H., Wang, L. M., Chen, J. C., Chen, K. L., Sou, U. C., Yang, H. C., and Jeng, J. T., "Fabrication and characterization of high-Tc Yba2Cu3O7? nanoSQUIDS made by focused ion beam milling," Nanotechnology 19, 315304 (2008).

Arpaia, R., Arzeo, M., Nawaz, S., Charpentier, S., Lombardi, F., and Bauch, T., "Ultra low noise Yba2Cu3O7 nano superconducting quantum interference devices implementing nanowires," Appl. Phys. Lett. 104, 072603 (2014).

Sirena, M., Matzen, S., Bergeal, N., Lesuer, J., Faini, G., Bernard, R., Briatico, J., and Crete, D. G. "Improving ion irradiated high Tc Josephson junctions by annealing: The role of vacancy-interstitial annihilation," Appl. Phys. Lett. 91, 142506 (2007).

MoberlyChan, W. J., Adams, D. P., Aziz, M. J., Hobler, G., and Schenkel, T., "Fundamentals of Focused Ion Beam Nanostructural Processing: Below, at, and Above the Surface," MRS Bulletin 32, 424 (2007).

Blamire, M. G., MacManus-Driscoll, J. L., Mathur, N. D., and Barber, Z. H., "The Materials Science of Functional Oxide Thin Films," Adv. Mater. 21, 3827 (2009).

Cojocaru, C.-V., Nechache, R., Harnagea, C., Pignolet, A., and Rosei, F., "Nanoscale patterning of functional perovakite-type complex oxides by pulsed laser deposition through a nanostencil," Appl. Surf. Sci. 256, 4777 (2010).

Chen, H. H., Urquidez, O. A., Ichim, S., Rodriguez, L. H., Brenner, M. P., Aziz, M. J., "Shocks in Ion Sputtering Sharpen Steep Surface Features," Science 310, 294 (2005).

* cited by examiner

600

| $y$(mm) | $c$(nm)$_{<005>}$ | $p$(h/Cu) | profile | $d$(nm) |
|---|---|---|---|---|
| 9.90 | 1.16851 | 0.1857 | V | 321 |
| 8.18 | 1.16866 | 0.1826 | V | 328 |
| 7.29 | 1.16872 | 0.1814 | V | 318 |
| 7.10 | 1.17018 | 0.1546 | V | 320 |
| 6.70 | 1.17053 | 0.1490 | V | 299 |
| 6.29 | 1.17220 | 0.1254 | V | 307 |
| 5.89 | 1.17267 | 0.1195 | ⊔ | 394 |
| 5.50 | 1.17282 | 0.1177 | ⊔ | 444 |
| 3.90 | 1.17294 | 0.1163 | ⊔ | 460 |
| 3.50 | 1.17562 | 0.0867 | ⊔ | 472 |
| 3.31 | 1.17667 | 0.0761 | ⊔ | 476 |
| 2.11 | 1.17839 | 0.0591 | * | * |
| 1.70 | 1.18104 | 0.0333 | ⊔ | 482 |
| 1.31 | 1.18496 | ~0 | ⊔ | 485 |
| 0.78 | 1.18757 | ~0 | ⊔ | 489 |
| 0.71 | 1.19013 | ~0 | ⊔ | 492 |

*FIG. 8*

METHOD FOR CREATING HIGH-RESOLUTION MICRO- TO NANO-SCALE STRUCTURES IN HIGH-TEMPERATURE SUPERCONDUCTOR FILMS

CROSS-REFERENCE TO RELATED APPLICATIONS

This application claims the benefit of U.S. Provisional Patent Application Ser. No. 62/301,547 filed Feb. 29, 2016, entitled "Method for Producing Films Having Sharp Charge Doping Discontinuities", the content of both of which being fully incorporated by reference herein.

FEDERALLY SPONSORED RESEARCH AND DEVELOPMENT

The Method for Creating High-Resolution Micro- to Nano-Scale Structures in High-Temperature Superconductor Films is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 103666.

BACKGROUND

Commercial and scientific applications of high-temperature superconducting (HTS) materials are rapidly growing as fabrication and production technologies advance in precision and scale. For example, a Josephson junction (JJ), a weak link between two superconductors, is an active element that serves as the building block of a wide segment of superconducting electronic circuits and devices. Ion milling is one method by which JJs are produced. However, existing processes can potentially damage the superconducting film during JJ formation. A need exists for an efficient method to fabricate large numbers of uniform JJs, or other types of structures, in HTS films without causing damage to the superconducting film.

BRIEF DESCRIPTION OF THE DRAWINGS

FIG. 8 shows a chart illustrating information about trenches produced using the embodiments disclosed herein.

DETAILED DESCRIPTION OF SOME EMBODIMENTS

Figure 1:
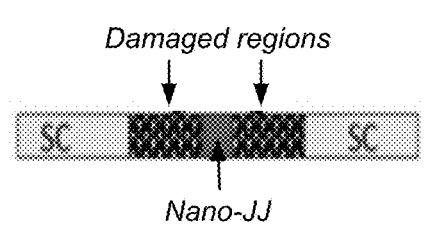
FIG. 1 shows a diagram depicting a nano-scale Josephson Junction (JJ) produced by a prior art helium-beam ion-damage method.

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

The embodiments of the method described herein may be used for the production of high-resolution structural features in films of high-Temperature (high-$T_c$) superconducting compounds. One example of such a compound is $YBa_2Cu_3O_x$ (6≤x≤7) (YBCO). One example of the type of structure that may be created is a trench along the film. The high-resolution, sharp profile ion milled trenches are observed to form under direct, unmasked exposure of a YBCO film to a focused ion beam source when the film has oxygen concentrations at and below the concentration of x≈6.72. The structures may be relatively large (~100 μm) or small (~10 nm). The ability to produce nm-scale structures is relevant to the production of devices having a large number of JJs on films of YBCO.

The embodiments of the method described herein may be used as either a complementary fabrication approach in concert with existing methods of creating grain boundary, step edge, or ion damaged formed JJs, or as a stand-alone method. With the level of precision achievable via this method it is possible to produce large numbers of uniform JJs ($\sim 10^6/cm^2$) having the Dayem-bridge geometry on a single chip.

As an example, for the production of high resolution features in general, the following steps may be utilized; 1) a film of YBCO is grown in a low oxygen state; 2) the film is directly exposed to a focused ion beam; and 3) the film is re-annealed to the desired high oxygen content state. As a further example, to produce a Dayem bridge JJ, the following steps may be utilized: 1) growth of a YBCO film with a uniform low oxygen content, either below $x \approx 6.72$ or 6.33, as desired or 1a) If the application of pressure proves to be required, then the YBCO film is to be initially grown with $x \approx 7$, then pressure is applied and the film is re-annealed in a reduced atmosphere to achieve a uniform low oxygen content over a region of the film, either below $x \approx 6.72$ or 6.33, as desired; 2) the film is removed from the pressure apparatus and annealing chamber and transferred to an ion milling chamber; 3) the film is then exposed to a focused ion beam to completely remove some regions entirely, and other regions partially, to form circuit paths, and Dayem bridge JJs, respectively; and 4) the film is transferred back to the annealing chamber and the film temperature and oxygen atmospheric pressure are set to achieve the desired final oxygen content (typically $x \approx 6.91$).

The embodiments of the method described herein may be applicable to other compounds with diffusive constituent atoms or molecules and having well-ordered low-dimensional sub-lattice structures. The relatively large ion milled regions described above ($\sim 100$ µm wide, 10 µm deep) can potentially be re-filled through a multi-layer/lithographic process or with the use of micro-/nano-stencils for the purpose forming integrated microelectronic devices utilizing $YBa_2Cu_3O_{7-\delta}$ and structurally/growth compatible functional oxides, i.e., multi-ferroic, optical, ferro-electric, etc., perovskite oxide compounds.

In some embodiments, the described method may be used to help create high-temperature superconducting circuits and devices with intrinsic superconducting p-n like junctions. The physical boundary between structural quantum super-lattice states is used to create a centimeter scale in length p-n like junction that can then be incorporated into superconducting circuitry in various functional configurations. Using a method described in part in U.S. Pat. No. 9,188,514 B1 to Taylor, a film of the high-Temperature superconducting compound $YBa_2Cu_3O_x$ [$6 \leq x \leq 7$] (and analogous materials) is prepared so that two adjacent regions are created having oxygen content of $x=7$ and $x \sim 6.81$, corresponding to the quantum super-lattice states referred to as <1> and <$1^4 0$> respectively.

The simplest structure that can be formed is a superconducting nano-wire bridging the p-n like boundary that forms between the adjacent quantum super-lattice states. The p-n diode is capable of emitting light by electron-hole recombination. This process enables a means by which to fully integrate superconducting and optical circuitry. Various other integrated devices are considered including Superconducting Quantum Interference Devices (SQUIDs), SQUID arrays, and methods for modulating coherent photon emission by the output of such superconducting devices.

FIG. 1 shows a diagram depicting a nano-scale JJ produced by a prior art helium-beam ion-damage method by Cybart et al., see "Nano Josephson Superconducting Tunnel Junctions in Y—Ba—Cu—O Direct-Pattered with Focused Helium Ion Beam", Nature Nanotechnology, vol. 10, pp. 598-602 (2015). Cybart's method inherently produces regions adjacent to the JJ that are ion-damaged, thereby precluding the correlation of JJs in the manner necessary for production of coherent THz emission.

Figure 2:
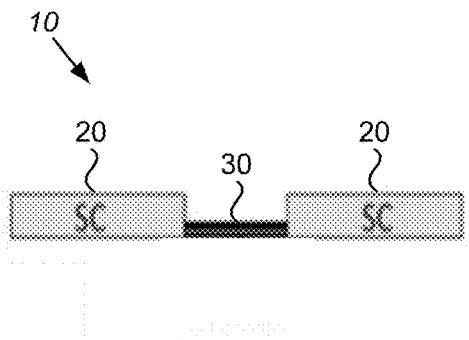
FIG. 2 shows a diagram of a nano-wire/nano-plane type JJ formed using the embodiments disclosed herein.

FIG. 2 shows a diagram of a nano-wire/nano-plane type JJ device 10 formed using the embodiments of the Method for Creating High-Resolution Micro- to Nano-Scale Structures in High-Temperature Superconductor Films. Device 10 includes a superconducting layer 20 having a JJ 30 formed therein. As shown, JJ 30 is dimensionally constrained compared to superconducting layer 20.

The embodiments of the method used to produce the JJs described herein are advantageous over other methods in two primary ways. First, embodiments of the method described herein may use a direct write ion milling method to sculpt nano-scale features as opposed to photolithographic masked methods. This reduces complexity of the fabrication process and allows for eventual development of multilayer circuitry—a process currently unavailable in high-Tc fabrication. The method described above entails ion-milling with inert ions (such as helium, argon, or neon) and then re-annealing the films to produce dimensionally constrained nano-wires or sheets (see FIGS. 3 and 4). Ion-damaged nano-scale junctions, such as those described by Cybart et al., cannot be re-annealed to repair the ionic lattice damage.

Further, in some embodiments, the described method may be used to help create an in-plane Josephson junction array THz laser. A sub-micron-scale coherent THz emitting circuit (THz laser) composed of high-density arrays of high-Temperature (high-$T_c$) superconducting JJs. The JJs may be formed from the low-anisotropic high-$T_c$ compound $YBa_2Cu_3O_7$ (or compositional analogs) using the ion milling method disclosed above. Coherent THz radiation can be produced from intrinsic JJs in highly anisotropic high-Tc superconductors wherein the tunneling process occurs between the widely separated two-dimensional (2-D) superconductive layers inherent to the crystal lattice structure.

Because the out-of-plane tunneling process proceeds between layers orthogonal to the crystal lattice long axis, the geometry of the junctions is effectively that of 2-D sheets stacked upon each other, and thus are commonly referred as JJ stacks. The laser may include of a long array of nano-scale ion-milled JJs wherein the tunneling process remains in the 2-D superconducting plane. The ion-milled JJs are spaced 10's of nanometers apart such that the coupling between the manufactured in-plane junctions is close to that found between the 2-D superconducting layers in highly anisotropic high-$T_c$ superconductors, thereby enabling accessing the same physics which makes coherent THz emission from JJ stacks possible.

A THz device made from such an array of JJs would enable a direct (one-way) link from superconducting to optical circuitry. The frequency and amplitude of the THz laser emission can then be modulated by voltage from an on-chip superconducting circuit or device.

Figure 3:
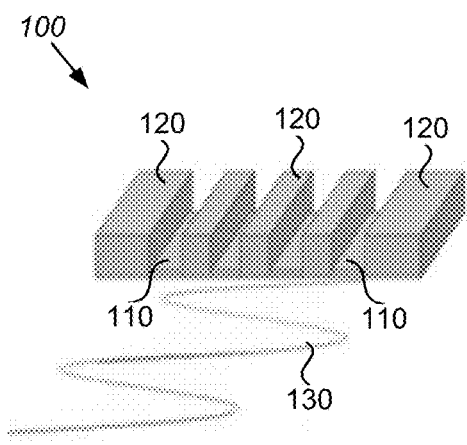
FIG. 3 shows a diagram illustrating an ion-milled JJ laser where a long JJ is formed between narrow, but fully superconducting, connecting regions.

FIG. 3 shows a diagram 100 illustrating an ion-milled JJ laser where a long JJ is formed between narrow, but fully superconducting, connecting regions. FIG. 3 shows a depiction of an ion-milled JJ laser where the junctions 110 are formed by dimensionally constraining the superconducting layer 120 in the out-of-plane direction, leaving a long JJ 110 between narrow, but fully superconducting connecting regions 120. THz emission 130 may be produced and controlled in an analogous manner to that established for JJ stacks.

Figure 4:
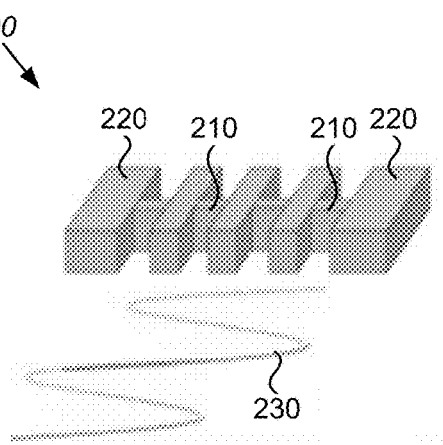
FIG. 4 shows a diagram illustrating an ion-milled JJ laser where each JJ is a nano-wire located between narrow, but fully superconducting, connecting regions.

FIG. 4 shows a diagram 200 illustrating an ion-milled JJ laser where each JJ is a nano-wire located between narrow, but fully superconducting, connecting regions. FIG. 4 shows a depiction of an ion-milled JJ laser where the JJ 210 are formed by dimensionally constraining the superconducting layer 220 in the in-plane direction such that each JJ 210 is a nano-wire located between narrow, but fully superconducting connecting regions 220. THz emission 230 may be produced and controlled in an analogous manner to that established for JJ stacks.

The above-described device has three distinct advantages including that the JJ stack lasers can only be fabricated from highly anisotropic high-Tc materials, typically from the bismuth (Bi) family of superconducting cuprate perovskites. Existing high-$T_c$ superconducting circuitry is exclusively made using the compound $YBa_2Cu_3O_x$, due to the ease of fabrication. In contrast, it is especially difficult to make films and circuits with Bi-based superconducting compounds. It is possible that the device described above could also be used as a low-power optical signal to voltage signal converter through an absorption process.

Figure 5:
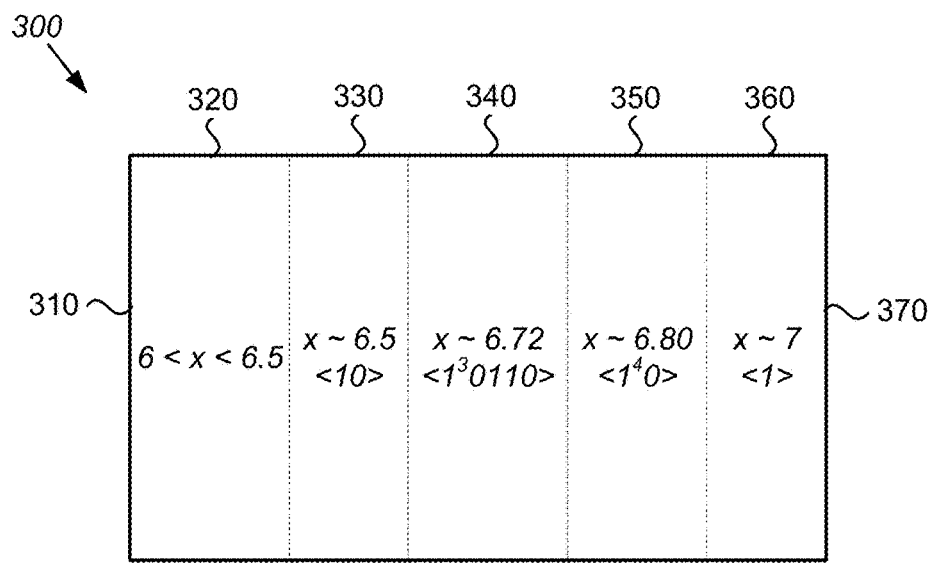
FIG. 5 shows a diagram illustrating a film created using the embodiments disclosed herein, the film having discrete regions of different oxygen content.

FIG. 5 shows a diagram illustrating a film 300 created using the embodiments disclosed herein. Film 300 has discrete regions of different oxygen content. As an example, film 300 may be produced using the system as described in U.S. Pat. No. 9,188,514 to Taylor and U.S. patent application Ser. No. 14/557,147 to Taylor, such system having a heat source and a heat sink with the film held in place between the heat source and the heat sink. Film 300 has a first end 310 and a second end 370. First end 310 is the end that was in contact with a heat source during the formation of the film, while second end 370 is the end that was in contact with the heat sink during formation of the film.

Film 300 has five discrete regions 320, 330, 340, 350, and 360. In region 320 a final stabilized oxygen state exists with an oxygen content x being between 6 and 6.5. In region 330 a final stabilized oxygen state <10> exists with an oxygen content of about 6.5. In region 340 a final stabilized oxygen state <1³0110> exists with an oxygen content of about 6.72. In region 350 a final stabilized oxygen state <1⁴0> exists with an oxygen content of about 6.80. In region 360 a final stabilized oxygen state <1> exists with an oxygen content of about 7.0.

Figure 6:
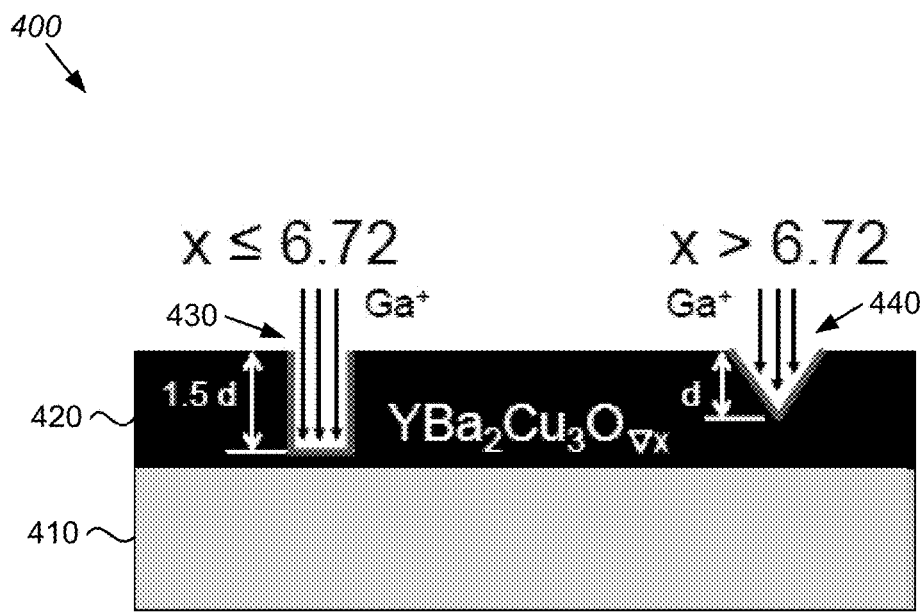
FIG. 6 shows a diagram illustrating examples of trench geometries formed, depending on the oxygen content, using the embodiments disclosed herein.

FIG. 6 shows a diagram illustrating a device 400 having examples of simplified trench geometries formed therein, depending on the oxygen content, using the embodiments of the Method for Creating High-Resolution Micro- to Nano-Scale Structures in High-Temperature Superconductor Films. Device 400 includes a substrate 410 having a film 420 of $YBa_2CuO_x$ disposed thereon, where 6≤x≤7. Film 420 has distinct regions that contain different levels of oxygen doping content, such as shown in FIG. 5. For example, film 420 may have discrete oxygen content levels including: 6<x<6.5, x≅6.5, x≅6.72, x≅6.8, and x=7.0. These distinct regions occur along the temperature gradient of the film.

Film 420 has a first trench region 430 that is located in a region of film 420 having an oxygen content level of x≤6.72. As shown, region 430 has a flat trench bottom. Film 420 also has a second trench region 440 that is located in a region of film 420 having an oxygen content level of x>6.72. As shown, region 440 has a pointed trench bottom. While the diagram in FIG. 6 shows simplified geometries, the diagram shown in FIG. 7 shows actual representations.

Figure 7:
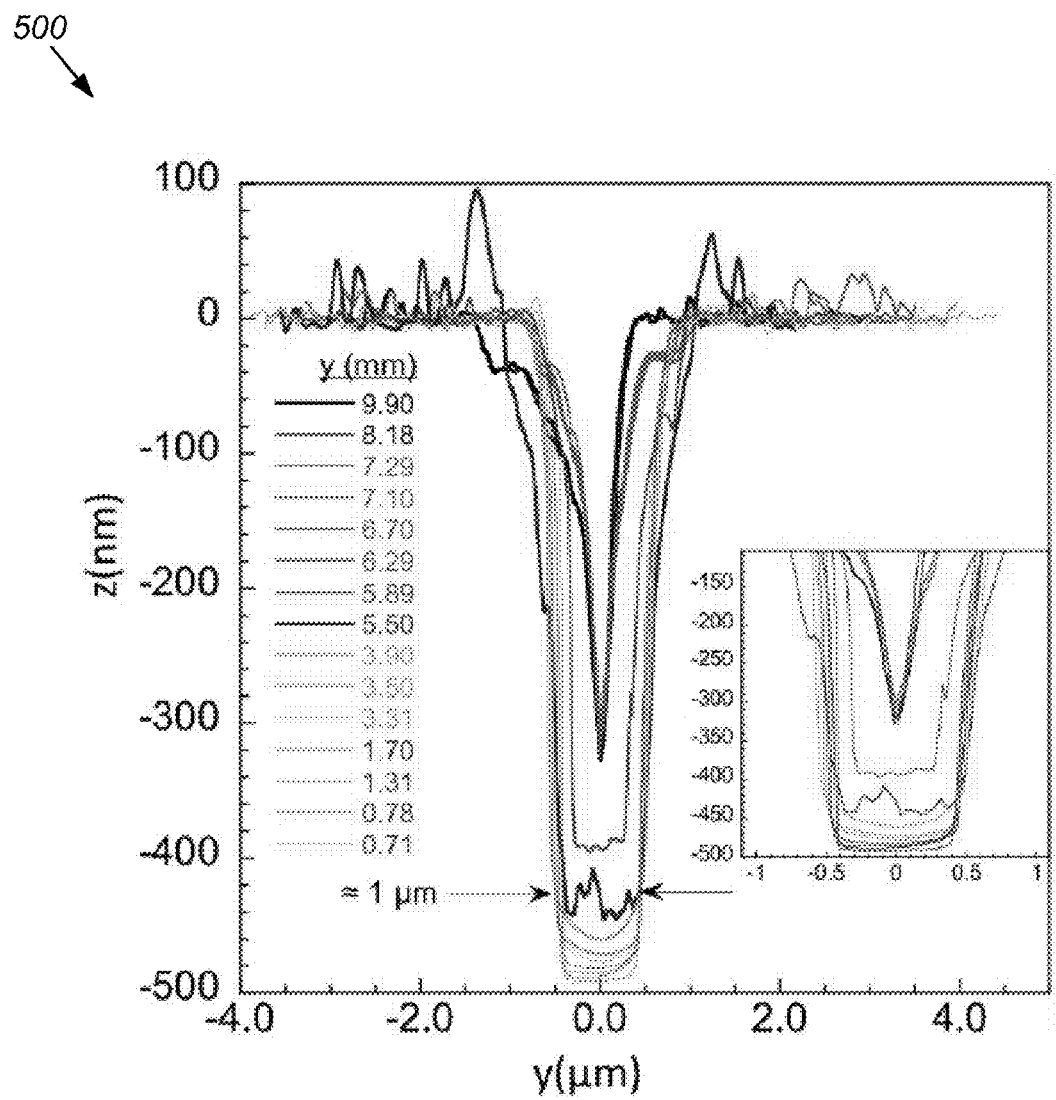
FIG. 7 shows a diagram illustrating 2-D profiles taken from sections of 3-D trench profile images of ion-milled trenches produced in accordance with the embodiments disclosed herein.

FIG. 7 shows a diagram 500 illustrating 2D profiles taken from sections of 3-D trench profile images of ion-milled trenches produced in accordance with the embodiments of the method disclosed herein. The images were taken at trench locations y(mm) indicated, with the trenches having the $CuO_2$ plane doping values as shown in chart 600 in FIG. 8. FIG. 8 shows a diagram 600 illustrating information including hole concentration p versus sample position y for a $YBa_2Cu_3O_7$ lattice unit cell. The values of p shown are determined from the values of c(nm), with such values determined using Eq. 2 of a publication to Liang et al. entitled "Evaluation of $CuO_2$ plane hole doping in $YBa_2Cu_3O_{6+x}$ single crystals", *Phys. Rev. B*, 73, (2006). The profile column represents the profile of a trench created by subsequently ion milling the film, with d representing the depth of the trench as a function of sample position.

The 3-D trench profile images were obtained from Atomic Force Microscopy (AFM) measurements of a prepared sample. The sample was prepared as follows: A uniform $YBa_2Cu_3O_x$ film with a thickness of t≅1500 nm was grown on a <001> $SrTiO_3$ substrate l×w=1.0 cm×1.0 cm) via the pulsed laser ablation method. From this uniformly doped $YBa_2Cu_3O_7$ film, a $YBa_2Cu_3O_{\nabla x}$ film was prepared using the apparatus and method described in U.S. Pat. No. 9,188,514 to Taylor and U.S. patent application Ser. No. 14/557,147 to Taylor, the content of both being fully incorporated by reference herein, with differences including that the film prepared and examined here was annealed in a slightly lower oxygen atmosphere with $P_{O_2}$=100 mTorr, and the applied pressure to the substrate/film was estimated to be ~100 MPa (≈20 times greater). The annealing time was kept the same at 12 hours.

The annealing apparatus applies heat to one edge of the substrate/film with the opposite edge of the substrate/film in contact thermally sunk—resulting in a linear thermal gradient across the sample ranging from 395° C. to 290° C. The film was directly etched, without a gold film over layer, using a FEI™ Nova 200 Nanolab™ DualBeam™ focused ion beam (FIB). The gallium source beam was run at an accelerating voltage of 30 kilovolts and a current of 0.5 nA. The FIB was set to run such that each line was nominally patterned to be 14.25 μm×2 μm using a serpentine pattern, with a beam spot diameter at 20 nm to 50 nm. Each line was etched 6 min and 41 sec under the same conditions. A set of 16 parallel trenches were milled along the sample length such that the first trench is located at the low oxygen end of the sample and the last is located near the fully oxygenated end. Prior to each trench scan, a larger surface area was cleaned using the FIB beam.

Two-dimensional (2-D) segments were extracted from the 3-D data at various locations along the length of each trench. Representative 2-D scans for each trench are shown in FIG. 7, with the exception of the trench at y=2.11 mm. An AFM measurement was not obtained for this line due to a contaminant "dust" particle being firmly lodged in the trench.

Figure 9:
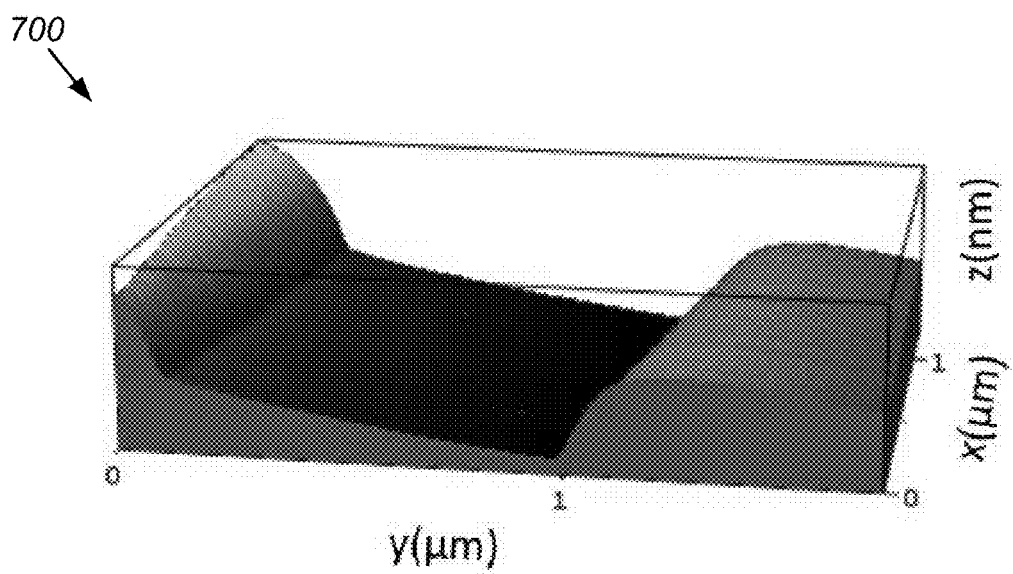
FIG. 9 shows a 3-D image of an ion-milled trench taken at y=0.72 mm.
Figure 10:
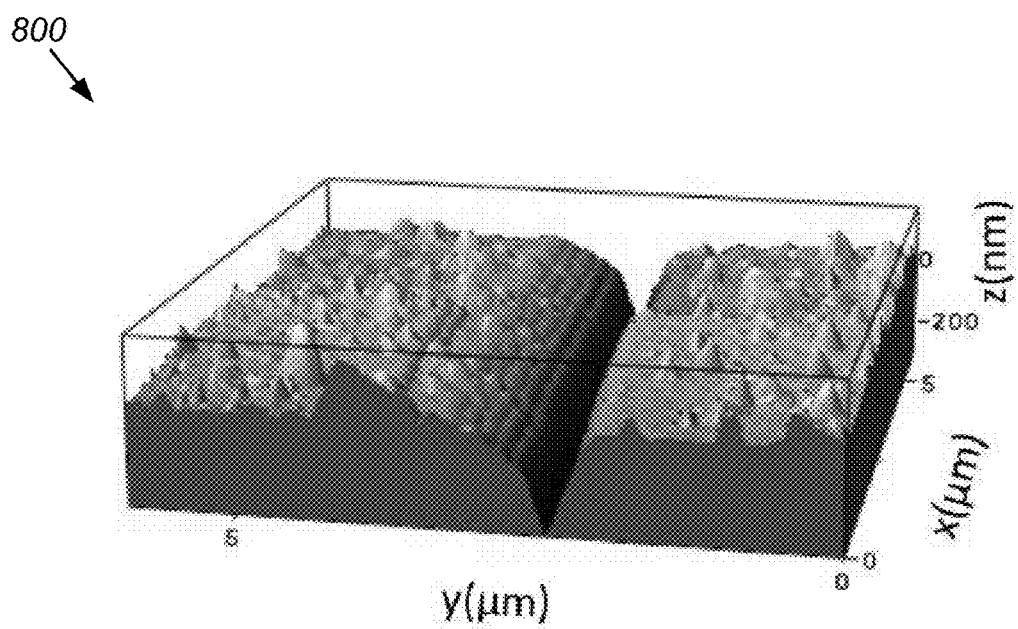
FIG. 10 shows a 3-D image of an ion-milled trench taken at y=8.18 mm.

Obtained 3-D profiles for two trenches at opposite ends of the sample are shown in FIGS. 9 and 10. The differences in trench profile and film morphology are readily seen. FIG. 9 shows a 3-D image 700 of an ion-milled trench taken at y=0.72 mm. Readily seen is the flat bottom profile of the trench. FIG. 10 shows a 3-D image 800 of an ion-milled trench taken at y=8.18 mm. The trench in FIG. 10 clearly has a v-shaped profile. FIGS. 9 and 10 illustrate the differences in trench profiles obtained at locations within the film having different oxygen content levels.

Figure 11:
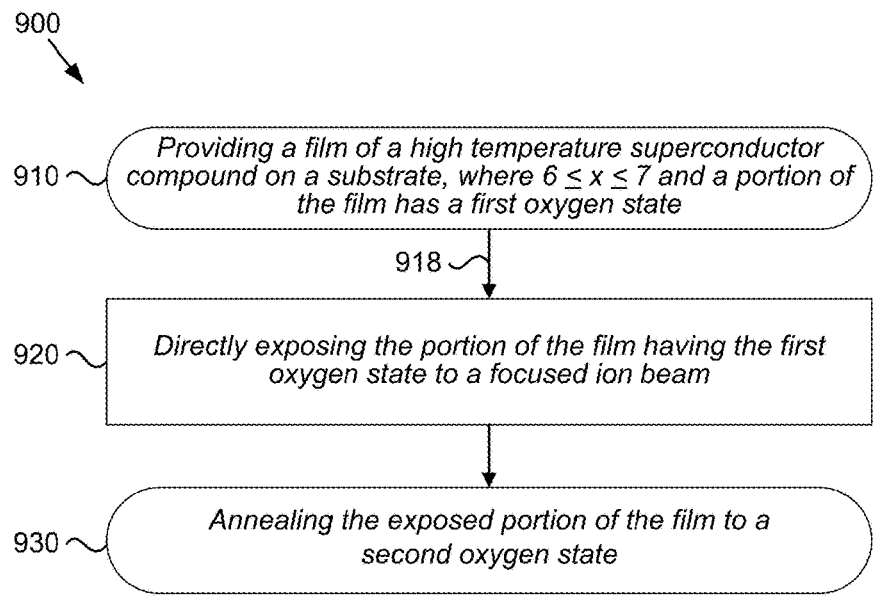
FIG. 11 shows a flowchart of an embodiment of a method in accordance with the embodiments disclosed herein.

FIG. 11 shows a flowchart of an embodiment of a method 900 in accordance with the Method for Creating High-Resolution Micro- to Nano-Scale Structures in High-Temperature Superconductor Films. As an example, method 900 may be performed by system 10, 100, and 200 as shown in FIGS. 1-3. Also, while FIG. 11 shows one embodiment of method 900 to include steps 910-930, other embodiments of method 900 may contain fewer or more steps. Further, while in some embodiments the steps of method 900 may be performed as shown in FIG. 11, in other embodiments the steps may be performed in a different order, or certain steps may occur simultaneously with one or more other steps.

Method 900 may begin with step 910, which involves providing a film on a substrate. In some embodiments, the film comprises two or more discrete regions each having a different oxygen state having a different oxygen content. In some embodiments, the film comprises a high-temperature superconductor compound belonging to the class of compounds having a compositional form of $R_{1-y}M_yBa_2Cu_{3-z}T_zO_x$, where x is oxygen content and $6 \leq x \leq 7$, wherein $0 \leq y \leq 1$, where $0 \leq z \leq 1$, where R comprises at least one of a rare earth and calcium, where M comprises at least one of a rare earth distinct from that of R and calcium if absent from R, where T comprises at least one of cobalt (Co), iron (Fe), nickel (Ni), and zinc (Zn). In some embodiments, at least one portion of the film has a first oxygen state having an oxygen content that is approximately less than or equal to 6.72.

In some embodiments, the substrate comprises one of: aluminum oxide ($Al_2O_3$), magnesium oxide (MgO), magnesium aluminate ($MgAl_2O_4$), zinc oxide (ZnO), strontium titanate ($SrTiO_3$), lanthanum aluminate ($LaAlO_3$), lithium niobate ($LiNbO_3$), neodynium gallate ($NdGaO_3$), strontium lanthanum aluminate ($SrLaAlO_3$), strontium lanthanum gallate ($SrLaGaO_3$), ytterbium aluminate ($YtAlO_3$), and yttria-($Y_2O_3$)-stabilized zirconia ($ZrO_2$)(YSZ).

Figure 12:
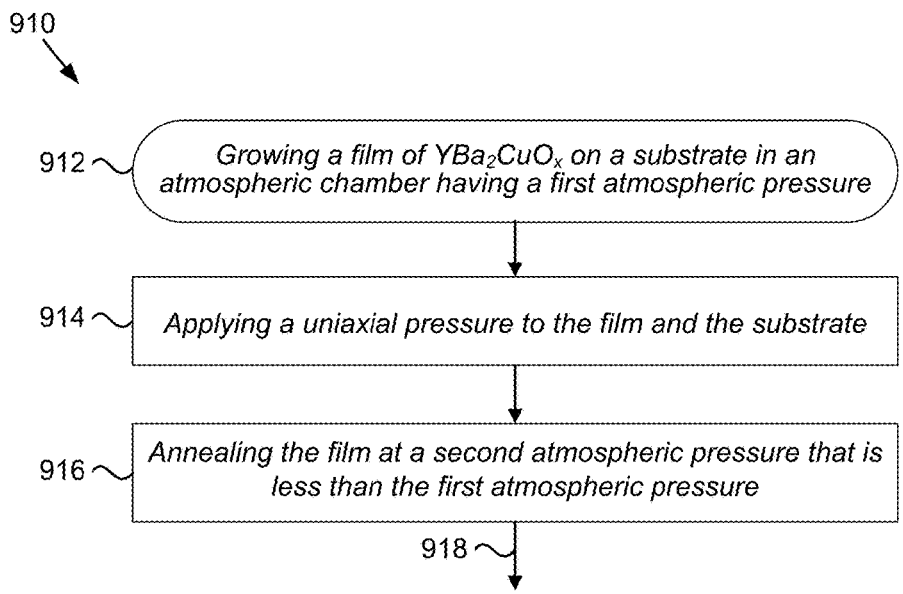
FIG. 12 shows a flowchart of an embodiment of a step for providing a film of a high-temperature superconductor compound on a substrate in accordance with the embodiments disclosed herein.

In some embodiments, step 910 includes steps 912-916 as shown in FIG. 12. Referring to FIG. 12, step 912 involves growing the film on the substrate in an atmospheric chamber having a first oxygen atmospheric pressure, where $x \cong 7$. Step 914 involves applying a uniaxial pressure to the film and the substrate. As an example, the uniaxial pressure applied to the film and the substrate may range from about 40 MPa to about 200 MPa. In some embodiments, the uniaxial pressure applied is about 100 MPa.

Step 916 involves annealing the film at a second oxygen atmospheric pressure. In some embodiments, the second oxygen atmospheric pressure is less than the first oxygen atmospheric pressure. In some embodiments, the film is annealed until a linear thermal gradient appears across the film. As an example, the linear thermal gradient may range from about 290° C. to about 395° C. Method 900 may then proceed to step 920 via flow path 918.

Step 920 involves exposing at least a portion of the film to a focused ion beam to create a structure within the film. In some embodiments the structure is a micro-structure. In some embodiments, the structure is a nano-structure. In some embodiments, the portion of the film exposed to a focused ion beam is the portion of the film having a first oxygen state having an oxygen content that is approximately less than or equal to 6.72. In some embodiments, the step of exposing the portion of the film to a focused ion beam to create a structure within the film comprises directly exposing the portion of the film to a focused ion beam without using masks.

In some embodiments, step 920 involves exposing the portion of the film to the focused ion beam until the portion of the film is completely removed. In some embodiments, the portion of the film that is completely removed comprises a trench along one of the length and the width of the film. In some embodiments, the portion of the film that is completely removed comprises a plurality of trenches along at least one of the length and the width of the film. In some embodiments, step 920 involves exposing the portion of the film to the focused ion beam until the portion of the film is partially removed.

In some embodiments, method 900 ends after step 920, while in other embodiments, method 900 further continues to step 930. Step 930 involves annealing the exposed portion of the film to a second oxygen state. In some embodiments, the oxygen content of the second oxygen state is greater than the oxygen content of the first oxygen state. In some embodiments, the oxygen content of the second oxygen state is less than the oxygen content of the first oxygen state. As an example, the film may initially have a first oxygen state with an oxygen content of about 7.0 and the film may be annealed until the oxygen content of the second oxygen state is about 6.5.

Many modifications and variations of the embodiments disclosed herein are possible in light of the above description. Within the scope of the appended claims, the disclosed embodiments may be practiced otherwise than as specifically described. Further, the scope of the claims is not limited to the implementations and embodiments disclosed herein, but extends to other implementations and embodiments as may be contemplated by those having ordinary skill in the art.

We claim:

1. A method comprising the steps of:
providing a film on a substrate, the film comprising a high-temperature superconductor compound belonging to the class of compounds having a compositional form of $R_{1-y}M_yBa_2Cu_{3-z}T_zO_x$, where x is oxygen content and $6 \leq x \leq 7$, wherein $0 < y \leq 1$, where $0 < z \leq 1$, where R comprises at least one of a rare earth and calcium, where M comprises at least one of a rare earth distinct from that of R and calcium if absent from R, where T comprises at least one of cobalt (Co), iron (Fe), nickel (Ni), and zinc (Zn), wherein at least one portion of the film has a first oxygen state having an oxygen content that is approximately less than or equal to 6.72; and
exposing the at least one portion of the film having a first oxygen state having an oxygen content that is approximately less than or equal to 6.72 to a focused ion beam until the portion of the film is completely removed to create a trench within the film.

2. The method of claim 1, wherein the step of exposing the portion of the film to a focused ion beam to create a trench within the film comprises directly exposing the portion of the film to a focused ion beam without using masks.

3. The method of claim 1 further comprising a step of annealing the exposed portion of the film to a second oxygen state, wherein an oxygen content of the second oxygen state is greater than the oxygen content of the first oxygen state.

4. The method of claim 1 further comprising a step of annealing the exposed portion of the film to a second oxygen state, wherein an oxygen content of the second oxygen state is less than the oxygen content of the first oxygen state.

5. The method of claim 1, wherein the substrate comprises one of: aluminum oxide ($Al_2O_3$), magnesium oxide (MgO), magnesium aluminate ($MgAl_2O_4$), zinc oxide (ZnO), strontium titanate ($SrTiO_3$), lanthanum aluminate ($LaAlO_3$), lithium niobate ($LiNbO_3$), neodymium gallate ($NdGaO_3$), strontium lanthanum aluminate ($SrLaAlO_3$), strontium lanthanum gallate ($SrLaGaO_3$), ytterbium aluminate ($YtAlO_3$), and yttria-($Y_2O_3$)-stabilized zirconia ($ZrO_2$)(YSZ).

6. The method of claim 1, wherein the trench comprises a structure, wherein the structure is a micro-structure.

7. The method of claim 1, wherein the trench comprises a structure, wherein the structure is a nano-structure.

8. The method of claim 1, wherein the film comprises two or more discrete regions each having a different oxygen state having a different oxygen content.

9. The method of claim 1, wherein the trench is disposed along one of the length and the width of the film.

10. The method of claim 1, wherein the trench has a width of about 1 mm.

11. The method of claim 1, wherein the trench has a depth of between about 325 nm and about 500 nm.

12. The method of claim 1, wherein the step of providing a film on a substrate comprises:
    growing the film on the substrate in an atmospheric chamber having a first oxygen atmospheric pressure, where $x \cong 7$;
    applying a uniaxial pressure to the film and the substrate; and
    annealing the film at a second oxygen atmospheric pressure, wherein the second atmospheric pressure is less than the first oxygen atmospheric pressure.

13. The method of claim 12, wherein the film is annealed until a linear thermal gradient appears across the film.

14. A method comprising the steps of:
    growing a film of $YBa_2CuO_x$ on a substrate in an atmospheric chamber having a first oxygen atmospheric pressure, where $x \cong 7$, wherein at least a portion of the film has a first oxygen state;
    applying a uniaxial pressure to the film and the substrate, wherein the uniaxial pressure applied to the film and the substrate is about 100 MPa;
    annealing the film at a second oxygen atmospheric pressure, wherein the second oxygen atmospheric pressure is less than the first oxygen atmospheric pressure;
    directly exposing the portion of the film having the first oxygen state to a focused ion beam; and
    annealing the exposed portion of the film to a second oxygen state and until a linear thermal gradient ranging from about 290° C. to about 395° C. appears across the film.

15. The method of claim 14, wherein the film is annealed until the second oxygen state is about 6.5.

16. A method comprising the steps of:
    growing a film of $YBa_2CuO_x$ on a substrate in an atmospheric chamber having a first oxygen atmospheric pressure, where $x \cong 7$, wherein at least a portion of the film has a first oxygen state, wherein the first oxygen state has an oxygen content that is approximately less than or equal to 6.72;
    applying a uniaxial pressure to the film and the substrate, wherein the uniaxial pressure applied to the film and the substrate is about 100 MPa;
    annealing the film at a second oxygen atmospheric pressure, wherein the second oxygen atmospheric pressure is less than the first oxygen atmospheric pressure;
    directly exposing the portion of the film having the first oxygen state to a focused ion beam until the portion of the film is completely removed; and
    annealing the exposed portion of the film to a second oxygen and until a linear thermal gradient appears across the film.

17. The method of claim 16, wherein the portion of the film that is completely removed comprises one or more trenches along one of the length and the width of the film.

* * * * *